(12) United States Patent
Akahane

(10) Patent No.: US 11,133,738 B2
(45) Date of Patent: Sep. 28, 2021

(54) SWITCHING CONTROL CIRCUIT

(71) Applicant: FUJI ELECTRIC CO., LTD., Kawasaki (JP)

(72) Inventor: Masashi Akahane, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 17/028,568

(22) Filed: Sep. 22, 2020

(65) Prior Publication Data

US 2021/0152073 A1 May 20, 2021

(30) Foreign Application Priority Data

Nov. 15, 2019 (JP) .............................. JP2019-207065

(51) Int. Cl.
*H02M 1/08* (2006.01)
*H03K 19/0185* (2006.01)
*H02M 3/07* (2006.01)

(52) U.S. Cl.
CPC ...... *H02M 1/08* (2013.01); *H03K 19/018507* (2013.01); *H02M 3/07* (2013.01)

(58) Field of Classification Search
CPC ... H02M 1/08; H02M 3/07; H03K 19/018507
USPC .................................................. 327/108, 109
See application file for complete search history.

(56) References Cited

U.S. PATENT DOCUMENTS

| 9,621,151 | B2* | 4/2017 | Kanda | ................ | H01L 29/7835 |
| 2004/0212408 | A1* | 10/2004 | Indoh | .................. | H03K 17/063 |
| | | | | | 327/143 |
| 2015/0303797 | A1* | 10/2015 | Akahane | ................ | H02M 1/32 |
| | | | | | 323/311 |
| 2016/0056818 | A1* | 2/2016 | Kanda | .................... | H02P 27/06 |
| | | | | | 318/504 |
| 2020/0295749 | A1* | 9/2020 | Akahane | ............. | H03K 17/162 |
| 2020/0382122 | A1* | 12/2020 | Niikura | ................ | H02M 3/155 |

FOREIGN PATENT DOCUMENTS

| JP | H09-172358 A | 6/1997 |
| JP | 2011-139423 A | 7/2011 |
| JP | 2013-048390 A | 3/2013 |

* cited by examiner

*Primary Examiner* — William Hernandez
(74) *Attorney, Agent, or Firm* — Rabin & Berdo, P.C.

(57) ABSTRACT

A switching control circuit that controls switching of a switching device of a bridge circuit for driving a load. The switching control circuit includes a control circuit that outputs, on a signal line, a control signal at first and second logic levels for turning on and off the switching device based on a set signal and a reset signal, respectively, a setting circuit that is connected to the signal line, and that sets the logic level of the signal line to the second logic level for a period after the reset signal is inputted to the control circuit and before the set signal is inputted to the control circuit, a holding circuit that is connected to the signal line, and that holds the logic level of the signal line, and a drive circuit that is connected to the holding circuit, and that drives the switching device based on the output of the holding circuit.

24 Claims, 7 Drawing Sheets

| set | reset | setdrn | resdrn | LTIN | |
|---|---|---|---|---|---|
| L | L | H | H | Hi-Z | DEFAULT |
| L | H | H | L | L | RESET |
| H | L | L | H | H | SET |
| H | H | L | L | Hi-Z | PROHIBITED |

FIG. 4

SWITCHING CONTROL CIRCUIT

CROSS-REFERENCE TO RELATED APPLICATIONS

The present application claims priority pursuant to 35 U.S.C. § 119(a) from Japanese patent application number 2019-207065, filed on Nov. 15, 2019, the entire disclosure of which is hereby incorporated by reference herein.

BACKGROUND

Technical Field

The present disclosure relates to a switching control circuit.

Description of the Related Art

There are known control circuits that control the switching of a switching device on the upper arm based on signals outputted from a microcomputer (for example, Japanese Patent Application Publication No. Hei 9-172358).

When the power supply on the high voltage side fluctuates, the control circuit, in some cases, erroneously generates a control signal for turning on the switching device when it should generate a control signal for turning off the switching device.

The present disclosure has been made in light of the problem in conventional techniques as described above, and an object thereof is to provide a switching control circuit capable of outputting an appropriate control signal even when the voltage on the high voltage side fluctuates.

SUMMARY

An aspect of the present disclosure to achieve the above objective is a switching control circuit that controls switching of a switching device of a bridge circuit for driving a load, comprising:
  a control circuit that outputs, on a signal line, a control signal at a first logic level for turning on the switching device based on a set signal for turning on the switching device and outputs, on the signal line, the control signal at a second logic level for turning off the switching device based on a reset signal for turning off the switching device;
  a setting circuit that is connected to the signal line, and that sets the logic level of the signal line to the second logic level for a period after the reset signal is inputted to the control circuit and before the set signal is inputted to the control circuit;
  a holding circuit that is connected to the signal line, and that holds the logic level of the signal line; and
  a drive circuit that is connected to the holding circuit, and that drives the switching device based on the output of the holding circuit.

The present disclosure makes it possible to provide a switching control circuit capable of outputting an appropriate control signal even when the voltage on the high voltage side fluctuates.

BRIEF DESCRIPTION OF THE DRAWINGS

For more thorough understanding of the present disclosure and advantages thereof, the following description should be read in conjunction with the accompanying drawings, in which:

FIG. 4 is a diagram illustrating a truth table for explaining the logical operation of a signal output circuit based on signals "set" and "reset";

DETAILED DESCRIPTION

The description in the present specification and the attached drawings make at least the following matters clear.

Present Embodiment

Figure 1:
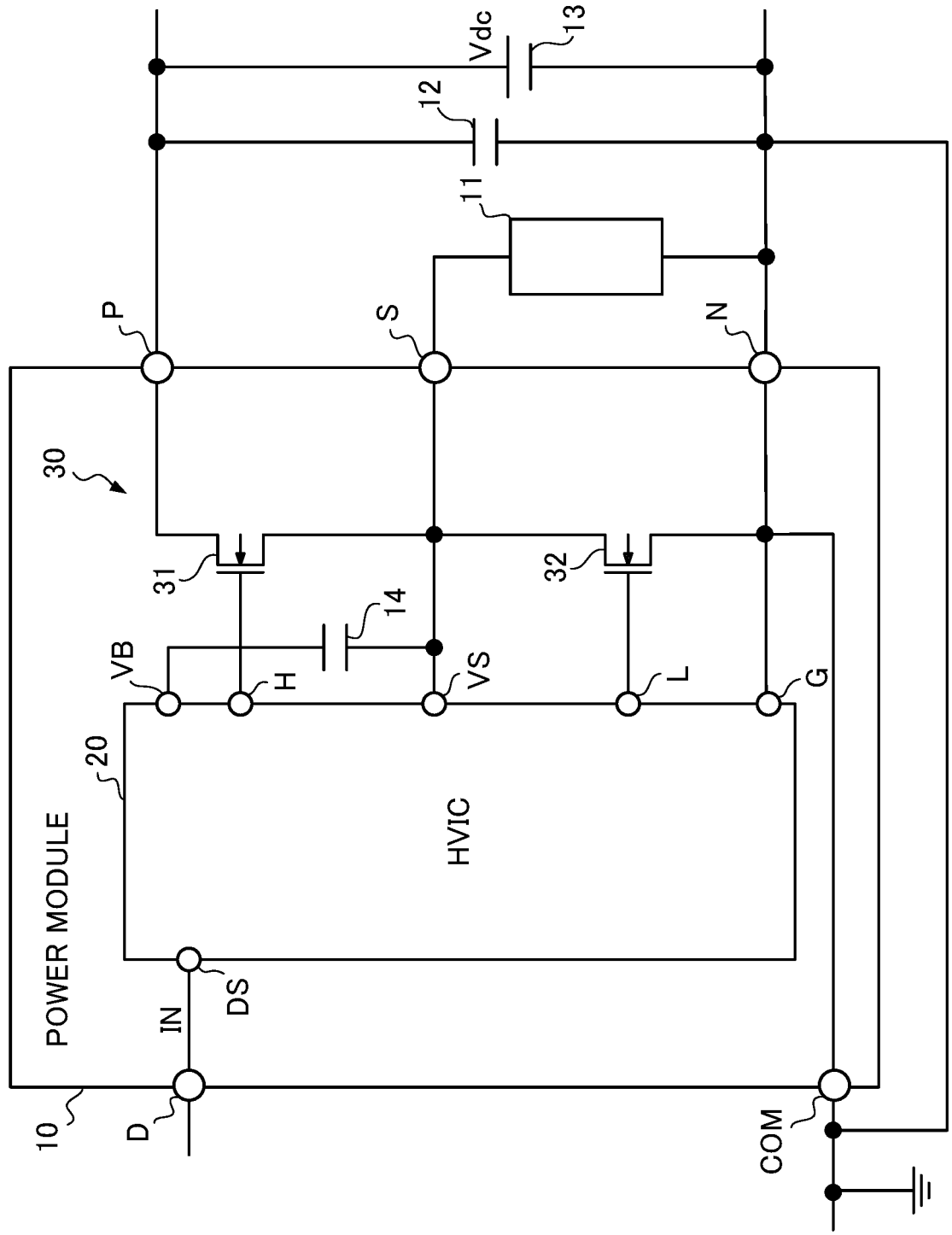
FIG. 1 is a diagram illustrating an example of the configuration of a power module.

FIG. 1 is a diagram illustrating an example of the configuration of a power module 10 according to an embodiment of the present disclosure.

<<Power Module 10>>

The power module 10 is a semiconductor device for driving a load 11 based on instructions from a microcomputer (not illustrated) and includes a capacitor 14, a switching control circuit 20, a half-bridge circuit 30, and terminals D, P, S, N, and COM.

The switching control circuit 20 is a high-voltage integrated circuit (HVIC) that controls the operation of the half-bridge circuit 30 based on an input signal IN inputted from the microcomputer (not illustrated). Although the details of the switching control circuit 20 will be described later, the switching control circuit 20 includes terminals DS, VB, H, VS, L, and G.

The half-bridge circuit 30 is a circuit that drives the load 11 and includes NMOS transistors 31 and 32.

The NMOS transistor 31 is a high-side switching device and has a gate electrode coupled to the terminal H and a source electrode coupled to a terminal S. The NMOS transistor 31 also has a drain electrode to which a specified voltage Vdc (for example, "400V") is applied via a terminal P.

The NMOS transistor 32 is a low-side switching device and has a gate electrode coupled to the terminal L and a drain electrode coupled to the terminal S. The source electrode of the NMOS transistor 32 is grounded.

The capacitor 12 is a device for stabilizing a power supply 13 that generates the specified voltage Vdc and has one end coupled to the terminal P and the other end coupled to a terminal N.

The capacitor 14 is a device to which a bootstrap voltage Vb for the operation of the high-side circuit is applied and has one end coupled to the terminal VB and the other end coupled to the terminal VS. The capacitor 14 is charged with the bootstrap voltage Vb provided from a charge pump circuit 101 described later and applied to the terminal VB. As a result, the bootstrap voltage Vb occurs across the capacitor 14.

For example, in the case where the voltage Vs at the terminal VS is "0 V", when the voltage of the gate electrode of the NMOS transistor 31 exceeds the threshold voltage of the NMOS transistor 31, the NMOS transistor 31 turns on. However, when the NMOS transistor 31 turns on, the voltage Vs of the terminal VS comes close to the voltage Vdc (for example, "400 V"). Hence, to keep the NMOS transistor 31 turned on, the NMOS transistor 31 needs to be driven such that the voltage of the gate electrode is higher than the threshold voltage of the NMOS transistor 31 with respect to the voltage Vs of the terminal VS to which the source electrode of the NMOS transistor 31 is coupled.

In the present embodiment, a voltage higher than the voltage Vs by the bootstrap voltage Vb with respect to a power supply line L1 (see FIG. 2) to which the voltage Vs of the terminal VS is applied occurs at the terminal VB. Thus, although the details will be described later, the switching control circuit 20 turns on the NMOS transistor 31 by using the bootstrap voltage Vb.

Note that the NMOS transistors 31 and 32 each correspond to a "switching device", and in particular, the NMOS transistor 31 corresponds to a "switching device in the upper arm".

<<Switching Control Circuit 20>>

Figure 2:
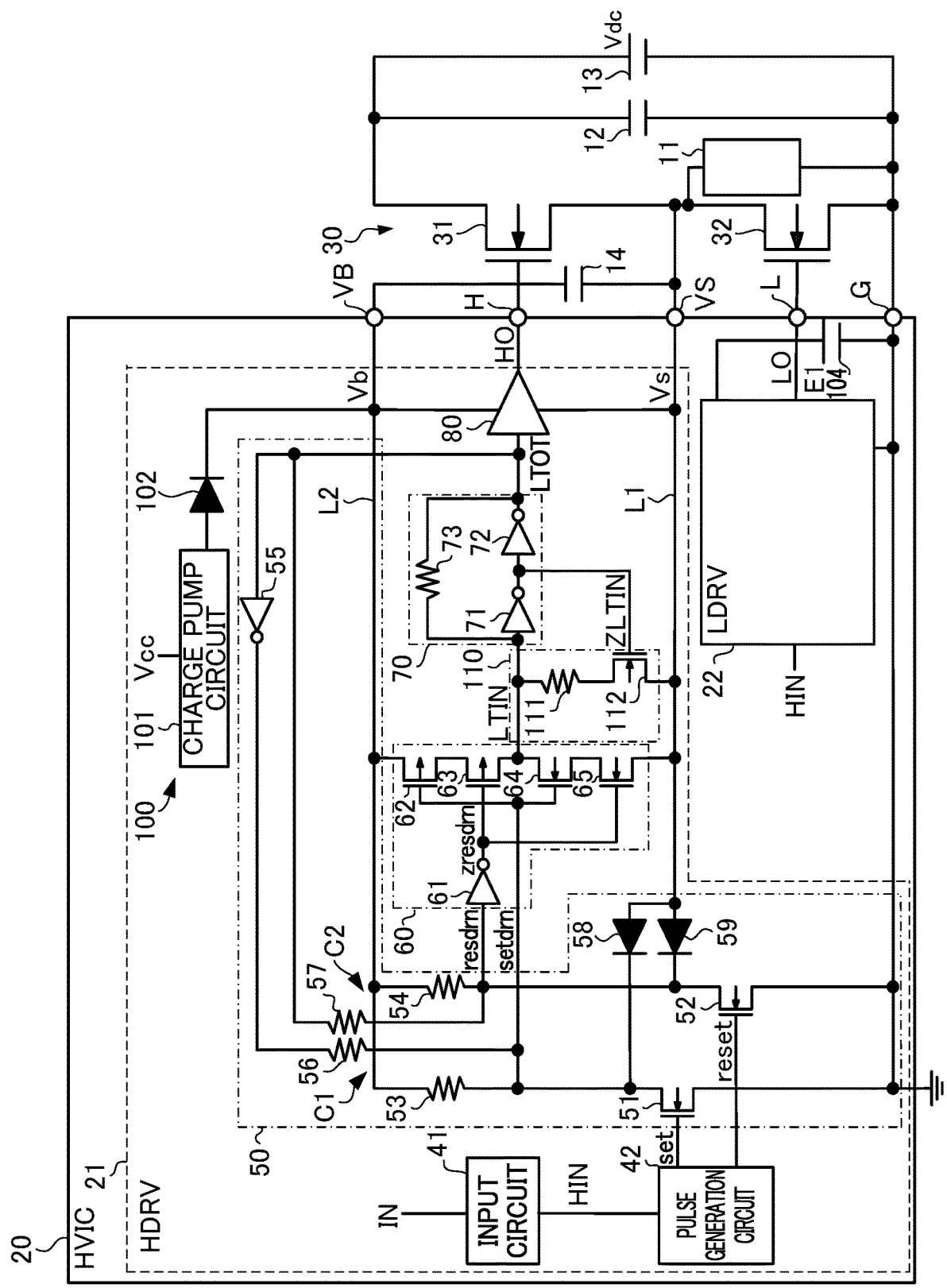
FIG. 2 is a diagram illustrating an example of the configuration of a switching control circuit.

FIG. 2 is a diagram illustrating an example of the configuration of the switching control circuit 20. The switching control circuit 20 includes a high-side drive circuit 21 (hereinafter referred to as an HDRV) (described later) that drives the upper-arm NMOS transistor 31 and a low-side drive circuit 22 (hereinafter referred to as an LDRV) (described later) that drives the lower-arm NMOS transistor 32. In FIG. 2, the terminal DS is omitted for convenience of illustration.

<<<HDRV 21>>>

The HDRV 21 is a circuit that drives the NMOS transistor 31 based on the input signal IN. The HDRV 21 includes an input circuit 41, a pulse generation circuit 42, a level shift circuit 50, a signal output circuit 60, a latch circuit 70, a buffer 80, a bootstrap circuit 100, and a pull-down circuit 110.

<<<<Input Circuit 41>>>>

The input circuit 41 detects the level of the input signal IN and outputs a signal HIN having the same logic level as the input signal IN. Specifically, when the input signal IN is at the high level (hereinafter referred to as the "H" level), the input circuit 41 outputs the signal HIN at the "H" level, and when the input signal IN is at the low level (hereinafter referred to as the "L" level), the input circuit 41 outputs the signal HIN at the "L" level. Note that the input circuit 41 includes, for example, a comparator (not illustrated) and a low-pass filter (not illustrated) for eliminating high-frequency noise in the output of the comparator.

<<<<Pulse Generation Circuit 42>>>>

The pulse generation circuit 42 outputs a set signal "set" for turning on the high-side NMOS transistor 31 and a reset signal "reset" for turning it off based on the signal HIN from the input circuit 41. Specifically, when the signal HIN is at the "H" level, the pulse generation circuit 42 outputs the set signal "set" at the "H" level, and when the signal HIN is at the "L" level, the pulse generation circuit 42 outputs the reset signal "reset" at the "H" level. Note that each of the set signal "set" and the reset signal "reset" in the present embodiment is a pulse signal the amplitude level of which changes from 0 V to the level of a low voltage Vcc (for example, 5V).

<<<<Level Shift Circuit 50>>>>

The level shift circuit 50 is a circuit that shifts each level of the set signal "set" and the reset signal "reset", which are generated by the pulse generation circuit 42 and operate with the low voltage Vcc, to a level that can operate the signal output circuit 60 (described later) of the HDRV 21 that operates with a high voltage Vb provided by a power supply line L2. Specifically, the level shift circuit 50 shifts the level of the set signal "set" and outputs a level-shifted set signal "setdrn" having an amplitude level of, for example, several tens volts. The level shift circuit 50 also shifts the level of the reset signal "reset" and outputs a level-shifted reset signal "resdrn" having an amplitude level of, for example, several tens volts.

The level shift circuit 50 includes NMOS transistors 51 and 52, resistors 53, 54, 56, and 57, an inverter 55, and diodes 58 and 59.

The NMOS transistor 51 has a drain electrode coupled to a resistor circuit C1 including the resistors 53 and 56. When the set signal "set" which is a positive pulse is inputted to the gate electrode of the NMOS transistor 51, the NMOS transistor 51 turns into an on-state, setting the level-shifted set signal "setdrn" to the "L" level.

In the same way, the NMOS transistor 52 has a drain electrode coupled to a resistor circuit C2 including the resistors 54 and 57. When the reset signal "reset" which is a positive pulse is inputted to the gate electrode of the NMOS transistor 52, the NMOS transistor 52 turns into an on-state, setting the level-shifted reset signal "resdrn" to the "L" level.

Note that the resistor circuit C1 formed by the resistors 53 and 56 changes based on an output signal LTOT of the latch circuit 70 (described later). In the same way, the resistor circuit C2 formed by the resistors 54 and 57 changes based on the output signal LTOT of the latch circuit 70 (described later).

The relationship between changes in the combined resistance of the resistor circuits C1 and C2 and changes in the level-shifted set signal "setdrn" and the level-shifted reset signal "resdrn" will be described later.

Note that, as an example, the resistance values of the resistors 53 and 54 each are 10 kΩ, and the resistance values of the resistors 56 and 57 each are 45 kΩ).

The diodes 58 and 59 clamp the drain electrodes of the NMOS transistors 51 and 52 at the voltage Vs of the power supply line L1. The diodes 58 and 59 have anodes coupled to the power supply line L1 and cathodes coupled to the drain electrodes of the NMOS transistors 51 and 52, respectively. This configuration prevents an overvoltage from being applied to the signal output circuit 60.

Note that the voltage Vb of the power supply line L2 corresponds to a "specified voltage". In addition, one of the power supply line L1 and the power supply line L2 corresponds to a "first line", and the other corresponds to a "second line". The combination of the resistor circuits C1 and C2 corresponds to an "adjustment circuit".

<<<<Signal Output Circuit 60>>>>

The signal output circuit 60 is a circuit that generates a signal LTIN for controlling a signal LTOT that the latch circuit 70 (described later) outputs. The signal output circuit 60 includes an inverter 61, PMOS transistors 62 and 63, and NMOS transistors 64 and 65. The operation of the signal output circuit 60 will be described later.

<<<<Latch Circuit 70>>>>

The latch circuit 70 is a circuit that holds the signal LTIN outputted from the signal output circuit 60 and outputs the held signal as the signal LTOT. The latch circuit 70 includes inverters 71 and 72 and a resistor 73.

In the latch circuit 70, when the signal LTIN turns to the "L" level, the output of the inverter 71 turns to the "H" level, and the output of the inverter 72 turns to the "L" level. In this case, in the latch circuit 70, the signaling line on which the signal LTIN is outputted is pulled down by the resistor 73. With this configuration, the latch circuit 70 keeps the signal LTOT at the "L" level even when the output of the signal output circuit 60 is put in a high-impedance state.

Conversely, when the signal LTIN turns to the "H" level, the output of the inverter 71 turns to the "L" level, and the output of the inverter 72 turns to the "H" level. In this case, in the latch circuit 70, the signaling line on which the signal LTIN is outputted is pulled up by the resistor 73. With this configuration, the latch circuit 70 keeps the signal LTOT at the "H" level even when the output of the signal output circuit 60 is put in a high-impedance state.

Although the description is based on an example in which the latch circuit 70 includes two inverters, as an example, the latch circuit 70 may include an even number greater than two of inverters.

Note that the latch circuit 70 corresponds to a "holding circuit", and the signaling line on which the signal LTIN is outputted corresponds to a "signal line". In addition, the inverters 71 and 72 correspond to a "first inverting circuit" and a "second inverting circuit", and the "first inverting circuit" and the "second inverting circuit" each may include an odd number greater than one of inverters. In addition, the resistor 73 corresponds to a "second resistor".

<<<<Buffer 80>>>>

The buffer 80 is a circuit that outputs a signal HO to drive the NMOS transistor 31 based on the control signal which is the signal LTOT from the latch circuit 70.

<<<<Pull-Down Circuit 110>>>>

The pull-down circuit 110 is a circuit that prevents the signal LTIN from erroneously turning to the "H" level when the signal LTOT should be at the "L" level at the time of restoration of the voltage Vb after a fluctuation occurs in the voltage Vb. The pull-down circuit 110 includes a resistor 111 and an NMOS transistor 112.

The resistor 111 has one end coupled to the signal LTIN which is the output of the signal output circuit 60 and the other end coupled to the drain electrode of the NMOS transistor 112. The NMOS transistor 112 has a source electrode coupled to the power supply line L1 and a gate electrode to which the output signal ZLTIN of the inverter 71 of the latch circuit 70 is inputted.

With this configuration, when the signal LTIN is at the "L" level, and the output signal ZLTIN of the inverter 71 is at the "H" level, the NMOS transistor 112 is on, and the output of the signal output circuit 60 is pulled down via the resistor 111.

With this configuration, the pull-down circuit 110 operates to set the signal LTIN to the "L" level when the signal LTIN should be at the "L" level.

Note that the pull-down circuit 110 corresponds to a "setting circuit". The NMOS transistor 112 corresponds to a "switch". In addition, the resistor 111 corresponds to a "first resistor".

<<<<Bootstrap Circuit 100>>>>

The bootstrap circuit 100 is a circuit that generates the voltage Vb, which is used for the NMOS transistor 31 to turn on, at the capacitor 14. The bootstrap circuit 100 includes the charge pump circuit 101 which operates with the low voltage Vcc and a bootstrap diode 102.

The charge pump circuit 101 generates a voltage for supplying the voltage Vb to the capacitor 14, from the low voltage Vcc.

The bootstrap diode 102 is a device for preventing the charge of the capacitor 14 from flowing to the charge pump circuit 101.

In this way, by charging the capacitor 14 using the low voltage Vcc, the bootstrap circuit 100 provides the voltage Vb that can turn on the NMOS transistor 31 even when the voltage Vs becomes high.

Here, since the capacitor 14 is located outside the switching control circuit 20, the voltage Vb could fluctuate because of a parasitic inductance or the like that the line to the capacitor 14 has.

<<<LDRV 22>>>

The LDRV 22 is a circuit that drives the NMOS transistor 32 based on the signal HIN from the input circuit 41. Specifically, the LDRV 22 outputs a signal LO having a logic level to which the logic level of the signal HIN is inverted and controls the switching of the NMOS transistor 32. Note that the LDRV 22 operates based on a power supply voltage E1.

<<Waveforms of Main Signals of Switching Control Circuit 20>>

Figure 3:
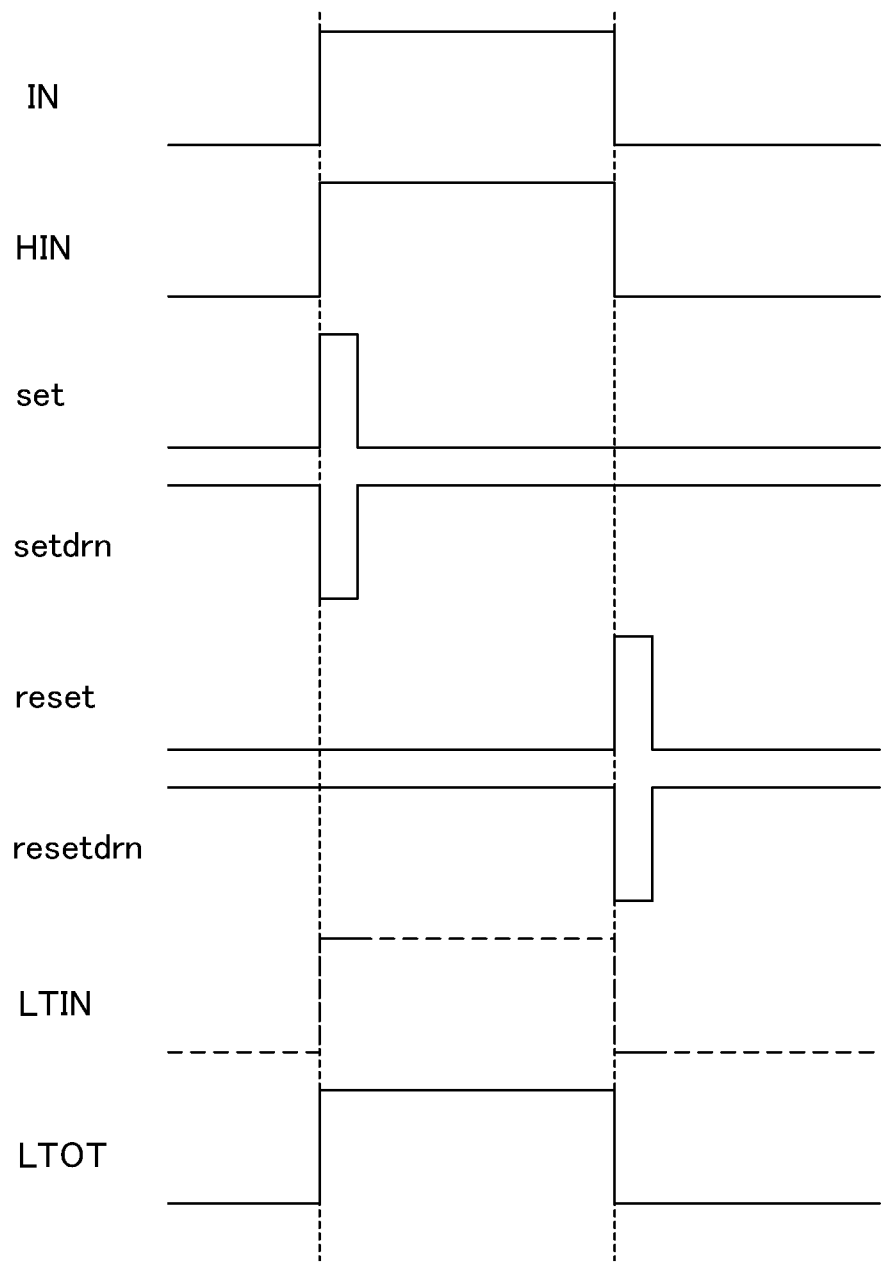
FIG. 3 is a diagram illustrating an example of the waveforms of main signals of the switching control circuit.

FIG. 3 is a diagram illustrating an example of the waveforms of main signals of the switching control circuit 20. The set signal "set" and the reset signal "reset" are generated by the pulse generation circuit 42, and the level-shifted set signal "setdrn" and the level-shifted reset signal "resdrn" are generated by the level shift circuit 50.

The pulse generation circuit 42 generates the set signal "set" which is a positive pulse at the rising edge of the signal HIN from the input circuit 41. The pulse generation circuit 42 also generates the reset signal "reset" which is a positive pulse at the falling edge of the signal HIN from the input circuit 41.

Based on the set signal "set" and the reset signal "reset" which are positive pulses, the level shift circuit 50 generates the level-shifted set signal "setdrn" and the level-shifted reset signal "resdrn" which are negative pulses.

When the level-shifted set signal "setdrn" at the "L" level is inputted to the signal output circuit 60, the signal output circuit 60 sets the signal LTIN to the "H" level. Also, when the level-shifted reset signal "resdrn" at the "L" level is inputted to the signal output circuit 60, the signal output circuit 60 sets the signal LTIN to the "L" level. Note that when the level-shifted set signal "setdrn" and the level-shifted reset signal "resdrn" turn to the "H" level, the signal LTIN turns into the high-impedance state.

The latch circuit 70 receives the signal LTIN and, as described earlier, outputs the signal LTOT.

<<Truth Table of Signal Output Circuit 60>>

FIG. 4 is a diagram illustrating the truth table for explaining the logical operation of the signal output circuit 60 based on the set signal "set" and the reset signal "reset". Based on the set signal "set" and the reset signal "reset" outputted from the pulse generation circuit 42, the level shift circuit 50 outputs the level-shifted set signal "setdrn" and the level-shifted reset signal "resdrn". Then, the level-shifted set signal "setdrn" and the level-shifted reset signal "resdrn" are inputted to the signal output circuit 60.

In the case where both the set signal "set" and the reset signal "reset" are at the "L" level, both the level-shifted set signal "setdrn" and the level-shifted reset signal "resdrn" are at the "H" level. At this time, the PMOS transistor 63 and the NMOS transistor 64 are on, and the PMOS transistor 62 and the NMOS transistor 65 are off. Thus, the output of the signal output circuit 60 is in a high-impedance output state. The state in which both the set signal "set" and the reset signal "reset" are at the "L" level, and in which the output of the signal output circuit 60 is in a high-impedance output state is called a "default state".

In the case where the signal "set" is at the "L" level, and the signal "reset" is at the "H" level, the level-shifted set signal "setdrn" is at the "H" level, and the level-shifted reset signal "resdrn" is at the "L" level. At this time, the NMOS transistors 64 and 65 are on, and the PMOS transistors 62 and 63 are off. Thus, the output of the signal output circuit 60 is at the "L" level. The state in which the signal "set" is at the "L" level and the signal "reset" is at the "H" level, and in which the output of the signal output circuit 60 is at the "L" level is called a "reset state".

In the case where the signal "set" is at the "H" level, and the signal "reset" is at the "L" level, the level-shifted set signal "setdrn" is at the "L" level, and the level-shifted reset signal "resdrn" is at the "H" level. At this time, the PMOS transistors 62 and 63 are on, and the NMOS transistors 64 and 65 are off. Thus, the output of the signal output circuit 60 is at the "H" level. The state in which the signal "set" is at the "H" level, and the signal "reset" is at the "L" level, and in which the output of the signal output circuit 60 is at the "H" level is called a "set state".

There is no case where both the set signal "set" and the reset signal "reset" are at the "H" level, and there is no case where both the level-shifted set signal "setdrn" and the level-shifted reset signal "resdrn" are at the "L" level. Hence, this state is called a "prohibited state".

As described above, when the signal "set" from the pulse generation circuit 42 turns to the "H" level, the signal output circuit 60 turns into the set state, and when the signal "reset" turns to the "H" level, the signal output circuit 60 turns into the reset state. In the case where both the signals "set" and "reset" are at the "L" level, the signal output circuit 60 is in the default state. Note that in the present embodiment, the "H" level corresponds to a "first logic level", and the "L" level corresponds to a "second logic level". However, in some cases the "L" level corresponds to the "first logic level", and the "H" level corresponds to the "second logic level".

<<Operation of Switching Control Circuit 20>>

==In the Case Where Signal LTOT is at "L" Level==

Figure 5:
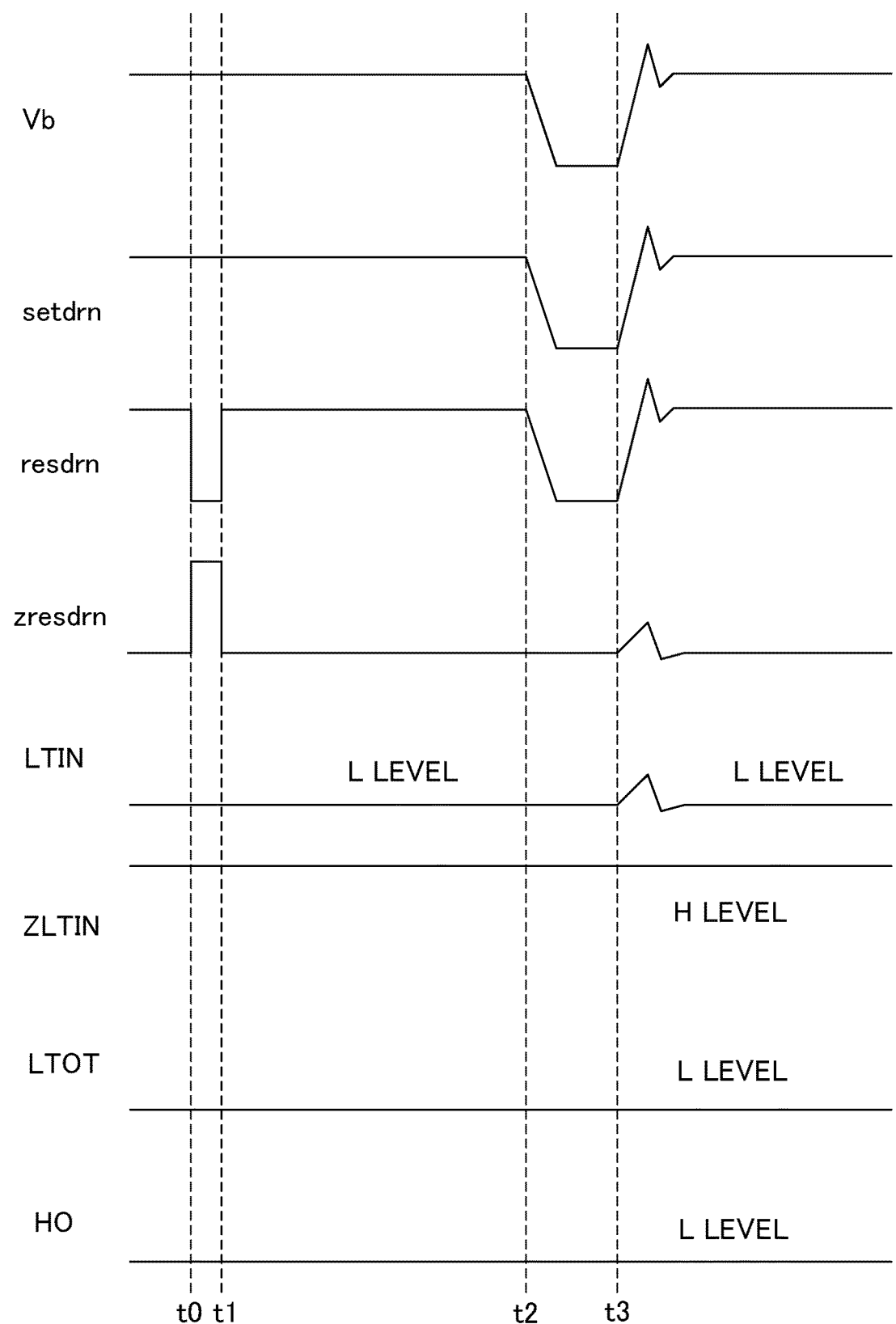
FIG. 5 is a diagram illustrating changes in signals LTIN, ZLTIN, and LTOT for the case in which a voltage Vb fluctuates and then is restored.

FIG. 5 is a diagram illustrating changes in the signals LTIN, ZLTIN, and LTOT for the case in which the voltage Vb fluctuates while the signal LTOT is at the "L" level.

First, at time t0, when the reset signal "reset" turns to the "H" level, the level-shifted reset signal "resdrn" turns to the "L" level. As a result, the signal output circuit 60 turns into the "reset state", the signal LTOT is at the "L" level. In this state, the resistors 53 and 56 in the resistor circuit C1 each having one end coupled to the power supply line L2 are coupled in parallel, and the node at which the level-shifted set signal "setdrn" is outputted is coupled to the other ends of the resistors 53 and 56. Thus, the impedance between the power supply line L2 of the resistor circuit C1 and the node at which the level-shifted set signal "setdrn" is outputted decreases.

Meanwhile, the resistor circuit C2 includes the resistor 54 coupled to the power supply line L2 and the resistor 57 coupled between the resistor 54 and the power supply line L1, and the level-shifted reset signal "resdrn" is outputted from the node at which the resistors 54 and 57 are coupled. Thus, the impedance between the power supply line L2 of the resistor circuit C2 and the node at which the level-shifted reset signal "resdrn" is outputted increases.

Then, when the reset signal "reset" turns to the "H" level at time t1, the signal output circuit 60 turns into the "default state".

Then, for example, the voltage Vb fluctuates between time t2 and time t3 due to noise or the like. Here, the impedance of the resistor circuit C1 becomes smaller than the impedance of the resistor circuit C2. As a result, the level-shifted set signal "setdrn" rises earlier than the level-shifted reset signal "resdrn". Thus, when the voltage Vb is restored, the signal output circuit 60 normally outputs the signal LTOT at the "L" level.

However, in the case where the level of the voltage Vb falls greatly, when the voltage Vb is restored, the on-resistances of the PMOS transistors 62 and 63 become small in some cases. As a result, the signal output circuit 60 sometimes outputs the signal LTOT at the "H" level. Hence, the switching control circuit 20 in the present embodiment has the pull-down circuit 110 to prevent the signal LTOT from being erroneously outputted at the "H" level.

Specifically, since the signal LTOT is at the "L" level at time t3, and it was at the "L" level even before time t3, the NMOS transistor 112 has been on. Thus, even if the output signal LTIN of the signal output circuit 60 fluctuates within the threshold voltage of the inverter 71 of the latch circuit 70, the signal LTOT remains at the "L" level because the signal LTOT is pulled down by the pull-down circuit 110.

As a result, the signals LTIN, LTOT, and HO are at the "L" level, and the NMOS transistor 31 is off. In this way, the switching control circuit 20 controls the NMOS transistor 31 in a safe state. In other words, in the present embodiment, even when a fluctuation occurs in the voltage Vb, since the NMOS transistor 112 is on, the signal output circuit 60 can remain in the "reset state".

==In the Case Where Signal LTOT is at "H" Level==

In the case where the signal output circuit 60 in the "set state", the signal LTOT is at the "H" level. With this, the resistor circuit C1 in FIG. 2 includes the resistor 53 coupled to the power supply line L2 and the resistor 56 coupled between the resistor 53 and the power supply line L1, and the level-shifted set signal "setdrn" is outputted from the node at which the resistors 53 and 56 are coupled. Thus, the impedance between the power supply line L2 of the resistor circuit C1 and the node at which the level-shifted set signal "setdrn" is outputted increases.

Meanwhile, for the resistor circuit C2, the resistors 54 and 57 each having one end coupled to the power supply line L2 are coupled in parallel, and the node at which the level-shifted reset signal "resdrn" is outputted is coupled to the other ends of the resistors 54 and 57. Thus, the impedance between the power supply line L2 of the resistor circuit C2 and the node at which the level-shifted reset signal "resdrn" is outputted decreases.

After that, when the signal output circuit 60 is in the default state, if a fluctuation occurs in the voltage Vb, the impedance of the resistor circuit C2 becomes smaller than the impedance of the resistor circuit C1, and as a result, the level-shifted reset signal "resdrn" rises earlier than the level-shifted set signal "setdrn". Thus, when the voltage Vb is restored after the fluctuation, the signal output circuit 60 operates so that the signal LTOT is at the "H" level.

In this case, since the NMOS transistor 112 is off, the signal LTIN will not be pulled down. Thus, in the present embodiment, in the case where a fluctuation occurs in the voltage Vb, it is possible to reliably make the signal LTIN at the "H" level. When a fluctuation occurs in the voltage Vb, since the NMOS transistor 112 is off, the signal output circuit 60 can remain in the "set state".

Note that the signaling line on which the signal LTIN is outputted corresponds to a "signal line". In addition, the node at which the level-shifted set signal "setdrn" is outputted corresponds to a "first node", and the node at which the level-shifted reset signal "resdrn" is outputted corresponds to a "second node". The NMOS transistor 51 corresponds to a "first NMOS transistor", and the NMOS transistor 52 corresponds to a "second NMOS transistor".

===Modification===

In the circuit of the present embodiment, the output signal ZLTIN of the inverter 71 of the latch circuit 70 is outputted to the gate electrode of the NMOS transistor 112 of the pull-down circuit 110.

Here, the NMOS transistor 112 may be controlled by the signal ZLTIN as illustrated in FIG. 2, or it may be controlled by the output of the inverter 55. Then, the buffer 80 may be implemented with two inverters, and the output of the first inverter may be used to control the NMOS transistor 112. In other words, depending on the design of the circuit subsequent to the signal output circuit 60, a signal other than the signal ZLTIN illustrated in FIG. 2 and the output of the inverter 55 may control the NMOS transistor 112.

Figure 6:
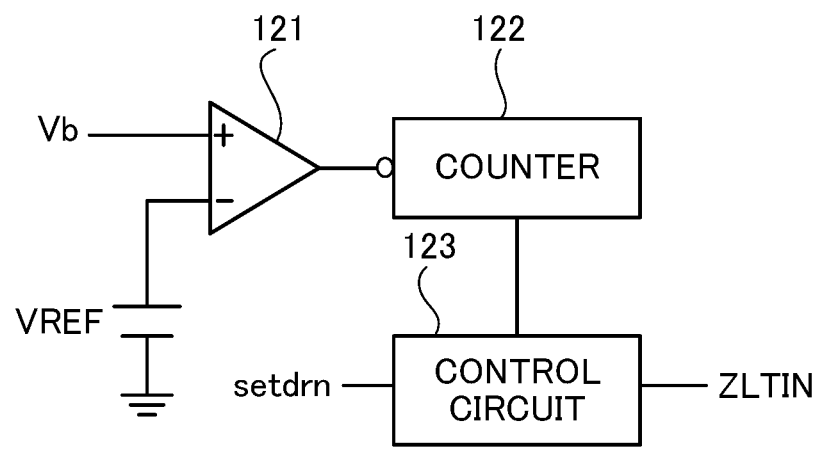
FIG. 6 is a diagram illustrating an example of the configuration of a modification of a circuit for controlling an NMOS transistor.

As an alternative configuration, a circuit that detects fluctuations in the voltage Vb may be used to output the signal ZLTIN as illustrated in FIG. 6. This circuit includes a comparator 121, a counter 122, and a switch control circuit 123. The comparator 121 compares the power supply Vb with a reference voltage VREF, and when the voltage Vb is lower than the reference voltage VREF, the comparator 121 outputs a signal at the "L" level. When the counter 122 receives the signal at the "L" level from the comparator 121 as a detection result, the counter 122 starts counting and keeps counting for a specified period. The switch control circuit 123 outputs a signal ZLTIN at the "H" level for the specified period. When the level-shifted set signal "setdrn" is restored from the fluctuation, the switch control circuit 123 outputs the signal ZLTIN at the "L" level. Note that the comparator 121 corresponds to a "detection circuit", and the counter 122 corresponds to a "counter".

In the circuit of the present embodiment, when the signal LTIN is at the "L" level, the NMOS transistor 31 is off, and when the signal LTIN is at the "H" level, the NMOS transistor 31 is on. However, as an alternative configuration of the circuit, when the signal LTIN is at the "H" level, the NMOS transistor 31 may be off, and when the signal LTIN is at the "L" level, the NMOS transistor 31 may be on. In this case, instead of the pull-down circuit 110, a pull-up circuit 110a may be employed for pulling-up to the power supply line L2.

Figure 7:
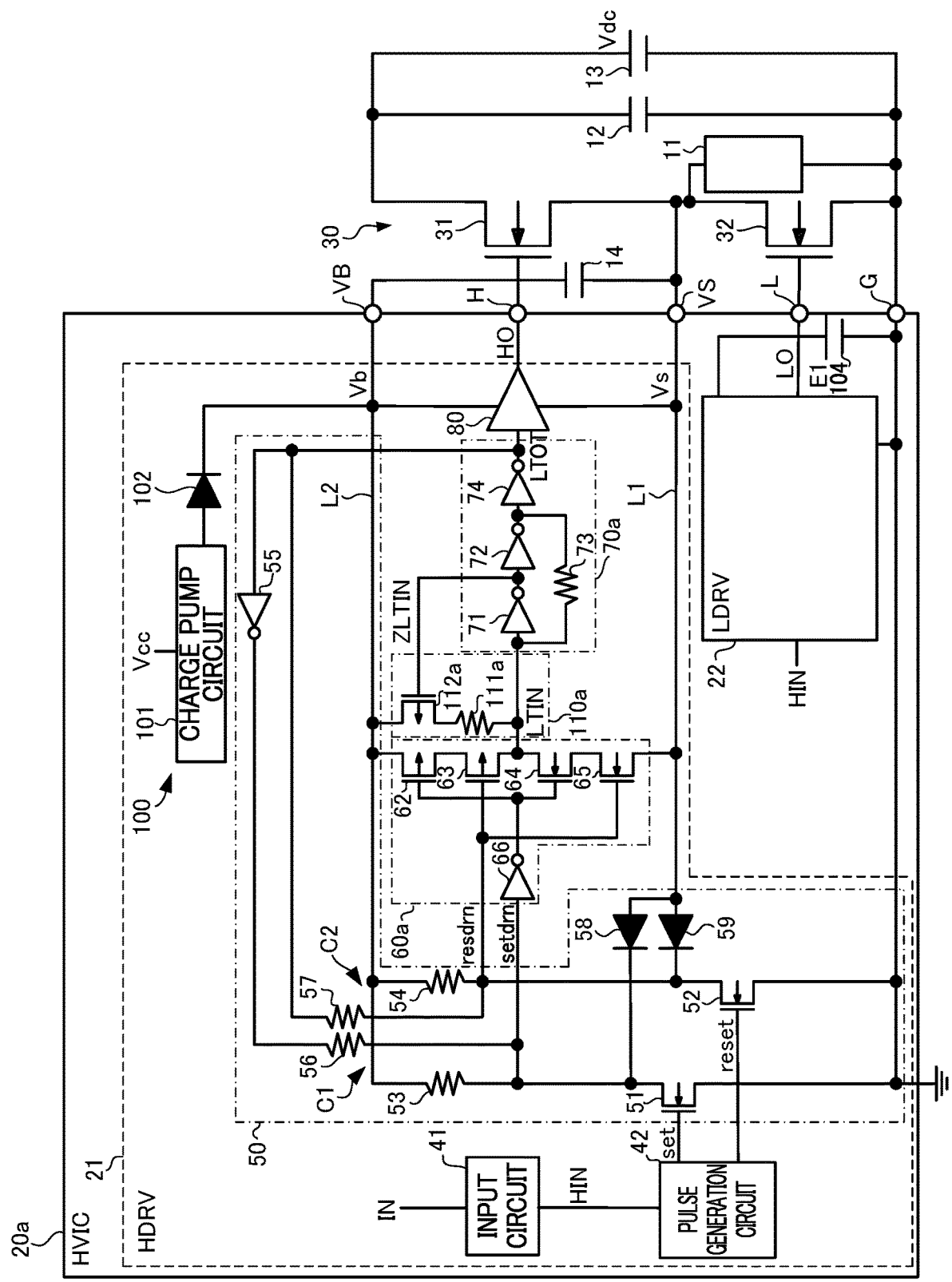
FIG. 7 is a diagram illustrating an example of the configuration of another switching control circuit.

Specifically, FIG. 7 illustrates an example of a switching control circuit 20a as the above modification. The switching control circuit 20a includes a pull-up circuit 110a instead of the pull-down circuit 110. The pull-up circuit 110a includes at least a PMOS transistor 112a. The pull-up circuit 110a may further include a resistor 111a. The switching control circuit 20a includes, instead of the signal output circuit 60, a signal output circuit 60a including PMOS transistors 62 and 63, NMOS transistors 64 and 65, and an inverter 66 that inverts the signal "setdrn". The switching control circuit 20a also includes, instead of the latch circuit 70, a latch circuit 70a including inverters 71 and 72, a resistor 73, and in addition, an inverter 74.

The PMOS transistor 112a may be controlled by the signal ZLTIN as illustrated in FIG. 7, or it may be controlled by the signal LTOT or the signal HO. In other words, depending on the design of the circuit subsequent to the signal output circuit 60a, a signal other than the signals ZLTIN, LTOT, and HO illustrated in FIG. 7 may control the PMOS transistor 112a.

===Recapitulation===

The power module 10 in the present embodiment has been described above. For example, when the voltage Vb is restored after a fluctuation, the output of the signal output circuit 60 is sometimes unstable depending on the relationship between the level-shifted set signal "setdrn" or the level-shifted reset signal "resdrn" and the signal output circuit 60. However, when a fluctuation occurs in the voltage Vb, since the output signal LTIN of the signal output circuit 60 is made at the "L" level, it is possible to output a signal of an appropriate logic level, and this prevents the NMOS transistor 31 from unintentionally turning on.

Since the NMOS transistor 112 which is turned on based on the logic level of the signal LTIN is used to make the output signal LTIN of the signal output circuit 60 at the "L" level, it is possible to output a signal at an appropriate logic level without a necessity of a large circuit scale.

In addition, with the resistor 111 provided in series with the NMOS transistor 112, the pull-down circuit 110 does not affect the operation even when the signal LTIN is at the "H" level.

In addition, the latch circuit 70 provided at the output of the signal output circuit 60 makes it possible to output a signal at an appropriate logic level even when the impedance of the output of the signal output circuit 60 becomes high.

The latch circuit 70 includes the inverters 71 and 72 and the resistor 73, and hence the circuit scale is small. Since the output of the inverter 71 is inputted to the NMOS transistor 112, it is possible to control the logic level of the signal LTIN appropriately according to the logic level of the signal LTIN.

In addition, the resistor circuits C1 and C2, the circuit configurations of which change based on the signal LTOT, are used. This makes it possible to adjust the return timings of the level-shifted set signal "setdrn" and the level-shifted reset signal "resdrn" after a fluctuation in the voltage Vb, and even when a fluctuation occurs in the voltage Vb, it is possible to make the logic level of the signal LTOT the same as the one before the fluctuation.

In addition, when a fluctuation in the voltage Vb is detected, the logic level of the signal LTIN is controlled appropriately, and thus it is possible to make the fluctuation in the voltage Vb be directly reflected on the control of the logic level of the signal LTIN.

Since the counter 122 counts for a specified period based on the detection of a fluctuation in the voltage Vb by the comparator 121 and causes the NMOS transistor 112 to be on for the period, it is possible to appropriately determine the period for which the logic level of the signal LTIN is controlled.

In addition, the latch circuit 70 provided at the output of the signal output circuit 60 makes it possible to output a signal at an appropriate logic level even when the impedance of the output of the signal output circuit 60 becomes high.

The switching control circuit 20 can be used to control the NMOS transistor 31 on the high side.

In the case where the switching control circuit 20 is used on the high side, the use of the capacitor 14, the charge pump circuit 101, and the bootstrap diode 102 makes it possible to turn on the NMOS transistor 31 in the normal manner.

Note that although the present embodiment is based on the assumption in which the half-bridge circuit 30 drives the load 11 as a "bridge circuit", it is not always the case that only the half-bridge circuit 30 drives the load 11. The "bridge circuit" only needs to be a circuit in which switching devices are used in upper and lower arms, and examples of the "bridge circuit" include an H bridge circuit and a three-phase inverter circuit.

The above embodiment is for making it easy to understand the present disclosure, and it is not for interpreting the present disclosure in a limited manner. In addition, it goes without saying that the present disclosure can be changed or improved without departing from the spirit and that the present disclosure includes equivalents thereof.

What is claimed is:

1. A switching control circuit that controls switching of a switching device of a bridge circuit for driving a load, comprising:
    a control circuit that
        outputs a control signal at a first logic level for turning on the switching device based on a set signal for turning on the switching device, and
        outputs the control signal at a second logic level for turning off the switching device based on a reset signal for turning off the switching device;
    a signal line connected to the control circuit to receive the control signal outputted by the control circuit;
    a setting circuit that is connected to the signal line, and that sets the logic level of the signal line to the second logic level for a period after the reset signal is inputted to the control circuit and before the set signal is inputted to the control circuit;
    a holding circuit that is connected to the signal line, the holding circuit being configured to receive the control signal, and to output an output signal on the signal line to hold the logic level of the signal line, the holding circuit being different from the control circuit; and
    a drive circuit that is connected to the holding circuit, and that drives the switching device based on the output signal of the holding circuit, wherein
    the setting circuit includes
        a first current path that is connected to the signal line to pull up the signal line, or a second current path that is connected to the signal line to pull down the signal line, such that a logic level of the signal line achieves the second logic level for the period after the reset signal is inputted to the control circuit and before the set signal is inputted to the control circuit, and
    the control circuit includes
        a third current path connected to the signal line to pull up the signal line based on the set signal, and
        a fourth current path connected to the signal line to pull down the signal line based on the reset signal.

2. The switching control circuit according to claim 1, further comprising:
    a first line to which a voltage corresponding to the second logic level is applied, wherein
    the setting circuit further includes a switch that is provided between the signal line and the first line, and that turns on for the period after the reset signal is inputted to the control circuit and before the set signal is inputted to the control circuit, and
    the holding circuit includes
        a first inverting circuit that inverts the logic level of the signal line,
        a second inverting circuit that inverts the logic level of an output of the first inverting circuit, and
        a second resistor that couples the signal line and an output of the second inverting circuit, and
    the output of the first inverting circuit is inputted to the switch.

3. The switching control circuit according to claim 1, wherein the control circuit includes
    a level shift circuit that
        outputs a signal generated by shifting the level of the set signal at a first node, and
        outputs a signal generated by shifting the level of the reset signal at a second node,
    a signal output circuit that
        outputs the control signal at the first logic level on the signal line based on the level-shifted set signal at the first node, and
        outputs the control signal at the second logic level on the signal line based on the level-shifted reset signal at the second node, and
    an adjustment circuit that,
        when the control signal at the second logic level is being outputted on the signal line, makes an impedance at the first node smaller than an impedance at the second node, and,
        when the control signal at the first logic level is being outputted on the signal line, makes the impedance at the second node smaller than the impedance at the first node.

4. The switching control circuit according to claim 1, further comprising:
    a first line to which a voltage corresponding to the second logic level is applied;
    a second line to which a voltage corresponding to the first logic level is applied;
    a detection circuit that detects a fluctuation in the voltage of the second line; and
    a switch control circuit that turns on a switch based on a detection result indicating that the detection circuit has detected the fluctuation in the voltage of the second line, wherein
    the switch is included in the setting circuit, and is provided between the signal line and the first line, and
    the switch turns on for the period after the reset signal is inputted to the control circuit and before the set signal is inputted to the control circuit.

5. The switching control circuit according to claim 4, further comprising:
    a counter that counts a specified period based on the detection result indicating that the detection circuit has detected the fluctuation in the voltage of the second line, wherein
    the switch control circuit turns on the switch for the specified period.

6. The switching control circuit according to claim 1, wherein
    said switching device is a switching device in an upper arm of the bridge circuit.

7. The switching control circuit according to claim 6, further comprising:
    a first line to which a voltage corresponding to the second logic level is applied;
    a second line to which a voltage corresponding to the first logic level is applied;
    a capacitor coupled between the second line and the first line;
    a charge pump circuit that generates a voltage used as the voltage applied to the second line; and
    a bootstrap diode coupled between the charge pump circuit and the second line, wherein
    the voltage of the second line is supplied from the capacitor.

8. A switching control circuit that controls switching of a switching device of a bridge circuit for driving a load, comprising:
    a control circuit that
        outputs, on a signal line, a control signal at a first logic level for turning on the switching device based on a set signal for turning on the switching device, and outputs, on the signal line, the control signal at a second logic level for turning off the switching device based on a reset signal for turning off the switching device;

a setting circuit that is connected to the signal line, and that sets the logic level of the signal line to the second logic level for a period after the reset signal is inputted to the control circuit and before the set signal is inputted to the control circuit;

a holding circuit that is connected to the signal line, and that holds the logic level of the signal line, the holding circuit including
 an even number of inverting circuits that are connected in series and are connected to the signal line, and
 a resistor connected in parallel with the even number of inverting circuits; and a drive circuit that is connected to the holding circuit, and that drives the switching device based on the output of the holding circuit.

9. The switching control circuit according to claim 8, further comprising:
 a first line to which a voltage corresponding to the second logic level is applied, wherein
 the setting circuit includes a switch that is provided between the signal line and the first line, and that turns on for the period after the reset signal is inputted to the control circuit and before the set signal is inputted to the control circuit.

10. The switching control circuit according to claim 9, wherein the setting circuit further includes another resistor provided between the first line and the signal line and coupled in series with the switch.

11. The switching control circuit according to claim 9, wherein
 the even number of inverting circuits include
  a first inverting circuit that inverts the logic level of the signal line, and
  a second inverting circuit that inverts the logic level of an output of the first inverting circuit;
 the resistor couples the signal line and an output of the second inverting circuit, and
 the output of the first inverting circuit is inputted to the switch.

12. The switching control circuit according to claim 9, further comprising:
 a second line to which a voltage corresponding to the first logic level is applied;
 a detection circuit that detects a fluctuation in the voltage of the second line; and
 a switch control circuit that turns on the switch based on a detection result indicating that the detection circuit has detected the fluctuation in the voltage of the second line.

13. The switching control circuit according to claim 12, further comprising:
 a counter that counts a specified period based on the detection result indicating that the detection circuit has detected the fluctuation in the voltage of the second line, wherein
 the switch control circuit turns on the switch for the specified period.

14. The switching control circuit according to claim 8, wherein
 the control circuit includes
  a level shift circuit that
   outputs a signal generated by shifting the level of the set signal at a first node, and
   outputs a signal generated by shifting the level of the reset signal at a second node,
  a signal output circuit that
   outputs the control signal at the first logic level on the signal line based on the level-shifted set signal at the first node, and
   outputs the control signal at the second logic level on the signal line based on the level-shifted reset signal at the second node, and
  an adjustment circuit that,
   when the control signal at the second logic level is being outputted on the signal line, makes an impedance at the first node smaller than an impedance at the second node, and,
   when the control signal at the first logic level is being outputted on the signal line, makes the impedance at the second node smaller than the impedance at the first node.

15. The switching control circuit according to claim 8, wherein
 said switching device is a switching device in an upper arm of the bridge circuit.

16. The switching control circuit according to claim 15, further comprising:
 a first line to which a voltage corresponding to the second logic level is applied;
 a second line to which a voltage corresponding to the first logic level is applied;
 a capacitor coupled between the second line and the first line;
 a charge pump circuit that generates a voltage used as the voltage applied to the second line; and
 a bootstrap diode coupled between the charge pump circuit and the second line, wherein
 the voltage of the second line is supplied from the capacitor.

17. A switching control circuit that controls switching of a switching device of a bridge circuit for driving a load, comprising:
 a control circuit that
  outputs, on a signal line, a control signal at a first logic level for turning on the switching device based on a set signal for turning on the switching device, and
  outputs, on the signal line, the control signal at a second logic level for turning off the switching device based on a reset signal for turning off the switching device;
 a setting circuit that is connected to the signal line, and that sets the logic level of the signal line to the second logic level for a period after the reset signal is inputted to the control circuit and before the set signal is inputted to the control circuit;
 a holding circuit that is connected to the signal line, and that holds the logic level of the signal line; and
 a drive circuit that is connected to the holding circuit, and that drives the switching device based on the output of the holding circuit, wherein
 the control circuit includes
  a level shift circuit that
   outputs a signal generated by shifting the level of the set signal at a first node, and
   outputs a signal generated by shifting the level of the reset signal at a second node,
  a signal output circuit that
   outputs the control signal at the first logic level on the signal line based on the level-shifted set signal at the first node, and outputs the control signal at the second logic level on the signal line based on the level-shifted reset signal at the second node, and an adjustment circuit that, when the control signal at the second logic level is being outputted on the signal line, makes an impedance at the first node smaller than an impedance at the second node, and, when the control signal at the first logic level is being outputted on the signal line, makes the impedance at the second node smaller than the impedance at the first node.

18. The switching control circuit according to claim 17, further comprising:

a first line to which a voltage corresponding to the second logic level is applied, wherein the setting circuit includes a switch that is provided between the signal line and the first line, and that turns on for the period after the reset signal is inputted to the control circuit and before the set signal is inputted to the control circuit.

19. The switching control circuit according to claim 18, wherein the setting circuit further includes a first resistor provided between the first line and the signal line and coupled in series with the switch.

20. The switching control circuit according to claim 18, wherein the holding circuit includes a first inverting circuit that inverts the logic level of the signal line, a second inverting circuit that inverts the logic level of an output of the first inverting circuit, and a second resistor that couples the signal line and an output of the second inverting circuit, and the output of the first inverting circuit is inputted to the switch.

21. The switching control circuit according to claim 18, further comprising:

a second line to which a voltage corresponding to the first logic level is applied;

a detection circuit that detects a fluctuation in the voltage of the second line; and a switch control circuit that turns on the switch based on a detection result indicating that the detection circuit has detected the fluctuation in the voltage of the second line.

22. The switching control circuit according to claim 21, further comprising:

a counter that counts a specified period based on the detection result indicating that the detection circuit has detected the fluctuation in the voltage of the second line, wherein the switch control circuit turns on the switch for the specified period.

23. The switching control circuit according to claim 17, wherein said switching device is a switching device in an upper arm of the bridge circuit.

24. The switching control circuit according to claim 23, further comprising:

a first line to which a voltage corresponding to the second logic level is applied;

a second line to which a voltage corresponding to the first logic level is applied;

a capacitor coupled between the second line and the first line;

a charge pump circuit that generates a voltage used as the voltage applied to the second line; and a bootstrap diode coupled between the charge pump circuit and the second line, wherein the voltage of the second line is supplied from the capacitor.

* * * * *